(12) United States Patent
Huang et al.

(10) Patent No.: US 9,136,162 B2
(45) Date of Patent: Sep. 15, 2015

(54) TRENCH FORMATION USING HORN SHAPED SPACER

(71) Applicant: Taiwan Semiconductor Manufacturing Company, Ltd., Hsin-Chu (TW)

(72) Inventors: Tsung-Min Huang, Taichung (TW); Chung-Ju Lee, Hsinchu (TW); Yung-Hsu Wu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/097,617

(22) Filed: Dec. 5, 2013

(65) Prior Publication Data

US 2015/0162238 A1    Jun. 11, 2015

(51) Int. Cl.
*H01L 21/44* (2006.01)
*H01L 21/768* (2006.01)
*H01L 21/321* (2006.01)
*H01L 21/32* (2006.01)
*H01L 21/311* (2006.01)

(52) U.S. Cl.
CPC .... *H01L 21/76802* (2013.01); *H01L 21/31111* (2013.01); *H01L 21/32* (2013.01); *H01L 21/3212* (2013.01); *H01L 21/7684* (2013.01); *H01L 21/76877* (2013.01)

(58) Field of Classification Search
USPC .......................................... 438/674, 692, 703
See application file for complete search history.

(56) References Cited

U.S. PATENT DOCUMENTS

| | | | |
|---|---|---|---|
| 2014/0024219 A1* | 1/2014 | Jung et al. | 438/703 |
| 2014/0264717 A1* | 9/2014 | Shieh et al. | 257/499 |

* cited by examiner

Primary Examiner — Timor Karimy
(74) Attorney, Agent, or Firm — Slater & Matsil, L.L.P.

(57) ABSTRACT

A method includes forming a mandrel layer over a target layer, and etching the mandrel layer to form mandrels. The mandrels have top widths greater than respective bottom widths, and the mandrels define a first opening in the mandrel layer. The first opening has an I-shape and includes two parallel portions and a connecting portion interconnecting the two parallel portions. Spacers are formed on sidewalls of the first opening. The spacers fill the connecting portion, wherein a center portion of each of the two parallel portions is unfilled by the spacers. Portions of the first opening that are unfilled by the spacers are extended into the target layer.

20 Claims, 11 Drawing Sheets

TRENCH FORMATION USING HORN SHAPED SPACER

BACKGROUND

Double patterning is a technology developed for lithography to enhance the feature density. Typically, for forming features of integrated circuits on wafers, the lithography technology is used, which involves applying a photo resist, and defining features on the photo resist. The features in the patterned photo resist are first defined in a lithography mask, and are implemented either by the transparent portions or by the opaque portions in the lithography mask. The features in the patterned photo resist are then transferred to the manufactured features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. In the double patterning technology, the closely located features are separated to two photolithography masks of a same double-patterning mask set, with both masks used to expose the same photo resist, or used to pattern the same hard mask. In each of the masks, the distances between features are increased over the distances between features in the otherwise a single mask, and hence the optical proximity effect is reduced, or substantially eliminated in the double patterning masks.

The double patterning, however, also suffers from drawbacks. For example, when two features have their lengthwise directions aligned to a same straight line, and the line ends of the features face each other, it is difficult to control the uniformity of the line end space due to the proximity effect and overlay variation. The line widths of the features are also difficult to control, especially when there are other features close to these two features.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Features with fine line spacing and the methods of forming the same are provided in accordance with various exemplary embodiments. The intermediate stages of forming the features are illustrated in accordance with some exemplary embodiments. The variations of the embodiments are discussed. Throughout the various views and illustrative embodiments, like reference numbers are used to designate like elements.

FIGS. 1A through 11 illustrate top views and cross-sectional views of intermediate stages in the formation of features in a target layer in accordance with some exemplary embodiments. Some of the top-view figures further include line C-C, wherein the cross-sectional view of the same structure is obtained from the horizontal plane containing line C-C in the top view.

Figure 1A:
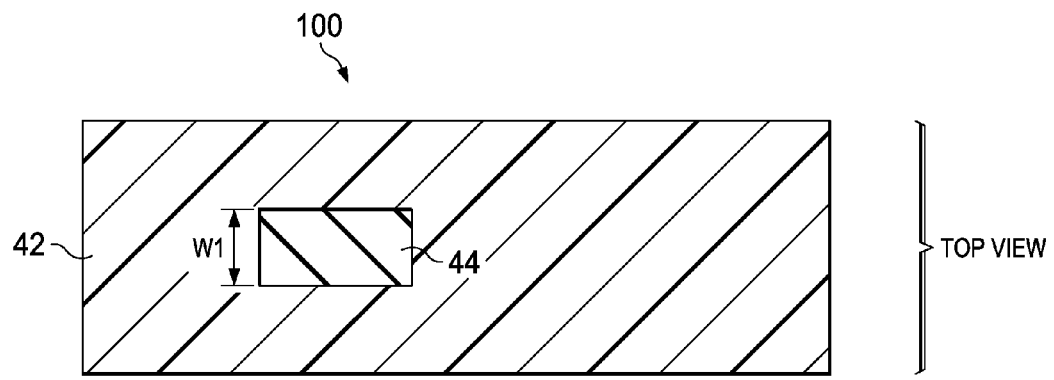
FIGS. 1A through 11 are top views and cross-sectional views of intermediate stages in the formation of features in a target layer in accordance with some exemplary embodiments.
Figure 1B:
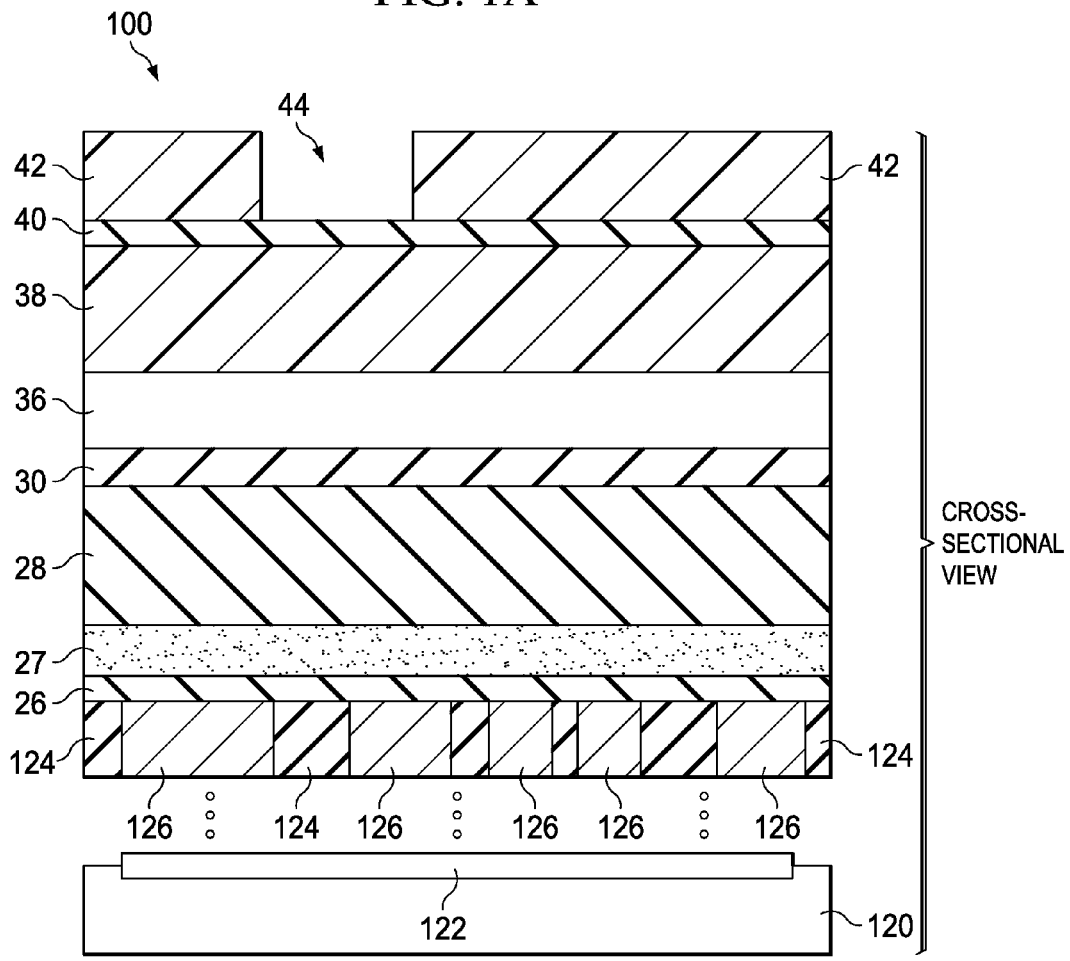

FIGS. 1A and 1B illustrate a top view and a cross-sectional view, respectively, of wafer 100, which includes substrate 120 and the overlying layers. Substrate 120 may be formed of a semiconductor material such as silicon, silicon germanium, or the like. In some embodiments, substrate 120 is a crystalline semiconductor substrate such as a crystalline silicon substrate, a crystalline silicon carbon substrate, a crystalline silicon germanium substrate, a III-V compound semiconductor substrate, or the like. Active devices 122, which may include transistors therein, are formed at a top surface of substrate 120.

Dielectric layer 124 is formed over substrate 120. In some embodiments, dielectric layer 124 is an Inter-Metal Dielectric (IMD) or an Inter-Layer Dielectric (ILD), which may be formed of a dielectric material having a dielectric constant (k value) lower than 3.8, lower than about 3.0, or lower than about 2.5, for example. In some embodiments, conductive features 126, which may be metallic features such as copper lines or tungsten contact plugs, are formed in dielectric layer 124. Etch stop layer 26 is formed over dielectric layer 124. Etch stop layer 26 may comprise a dielectric material such as silicon carbide, silicon nitride, or the like.

In some embodiments, as shown in FIG. 1B, oxide layer 27 is formed over etch stop layer 26. Oxide layer 27 acts as a glue layer to improve the adhesion between etch stop layer 26 and the overlying dielectric layer 28. In some embodiments, oxide layer 27 comprises a tetraethylorthosilicate (TEOS) oxide.

Dielectric layer 28 is further formed over oxide layer 27. Dielectric layer 28 may be an IMD layer, which is formed of a dielectric material having a dielectric constant (k value) lower than 3.8, lower than about 3.0, or lower than about 2.5, for example. Dielectric layer 28 may comprise carbon, and may have pores therein. In alternative embodiments, dielectric layer 28 is a non-low-k dielectric layer having a k value higher than 3.8.

In alternative embodiments, layer 28 is a semiconductor substrate. In these embodiments, there may not be additional layers underlying layer 28. Hence, the illustrated layers 120, 124, 26, and 27 as shown in FIG. 1B may not be formed. Throughout the description, layer 28 is also referred to as a target layer, in which a plurality of patterns is to be formed therein in accordance with the embodiments of the present disclosure.

Over low-k dielectric layer 28 resides dielectric hard mask 30, which may be formed of silicon oxide (such as TEOS oxide), Nitrogen-Free Anti-Reflective Coating (NFARC, which is an oxide), silicon carbide, silicon oxynitride, or the like. The formation methods include Plasma Enhance Chemical Vapor Deposition (PECVD), High-Density Plasma (HDP) deposition, or the like.

Mandrel layer 36 is formed over dielectric hard mask 30. In some embodiments, mandrel layer 36 is in contact with dielectric hard mask 30, with no additional layer formed between mandrel layer 36 and dielectric hard mask 30. In some embodiments, mandrel layer 36 is formed of amorphous silicon or another material that has a high etching selectivity with the underlying dielectric hard mask 30.

FIGS. 1A and 1B illustrate a first photolithography process. Over mandrel layer 36 (FIG. 1B) is formed a tri-layer comprising under layer (sometimes referred to as a bottom layer) 38, middle layer 40 over under layer 38, and upper layer 42 over middle layer 40. In some embodiments, under layer 38 and upper layer 42 are formed of photo resists, which comprise organic materials. Middle layer 40 may comprise an inorganic material, which may be a nitride (such as silicon nitride), an oxynitride (such as silicon oxynitride), an oxide (such as silicon oxide), or the like. Middle layer 40 has a high etching selectivity with relative to upper layer 42 and under layer 38, and hence upper layer 42 is used as an etching mask for the patterning of middle layer 40, and middle layer 40 is used as an etching mask for the patterning of under layer 38. After the application of upper layer 42, upper layer 42 is patterned. Upper layer 42 is patterned to form opening 44. The formation of under layer 38, middle layer 40, and upper layer 42 and the exposure and the development of upper layer 42 are referred to as a first photolithography (photo) process.

Figure 2A:
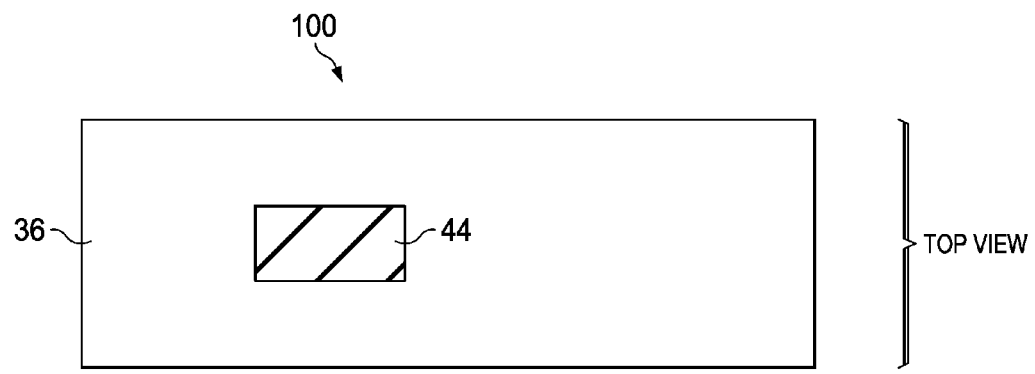
Figure 2B:
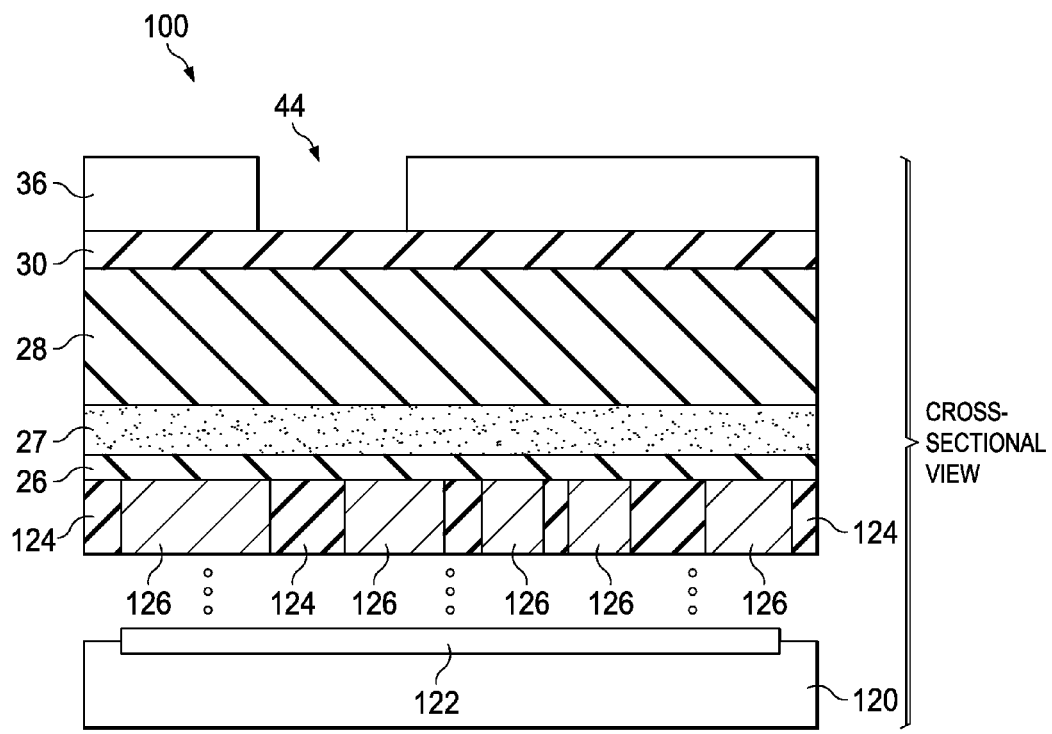

Referring to FIGS. 2A and 2B, which include a top view and a cross-sectional view, respectively, a first etching process is performed to transfer the pattern in upper layer 42 into mandrel layer 36. The respective step is also referred to as a cut etch step. During the etching step, upper layer 42, middle layer 40, and under layer 38 may be consumed. If any residue part of upper layer 42, middle layer 40, and under layer 38 is left after the etching of mandrel layer 36, the residue part is removed. FIGS. 2A and 2B illustrate the resulting structure. The etching is anisotropic, so that the opening 44 in mandrel layer 36 has the same or similar size as the respective opening 44 in upper layer 42 (FIG. 1B).

Figure 3A:
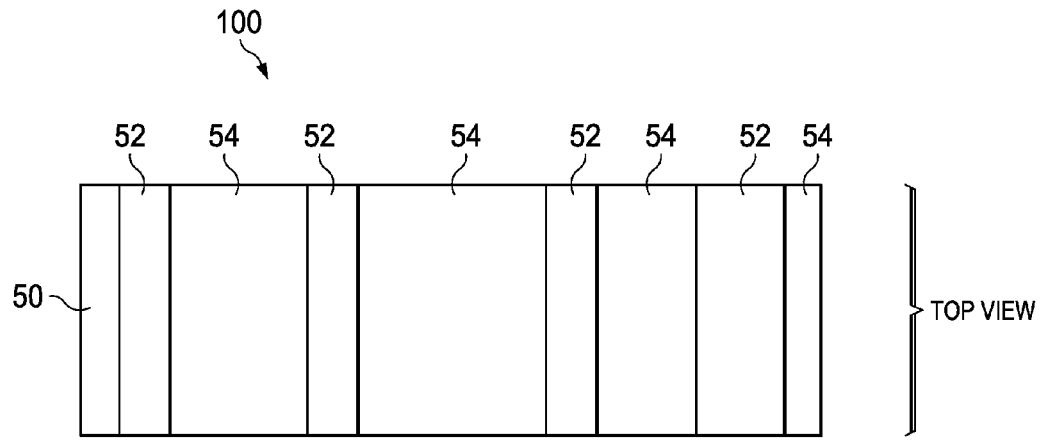
Figure 3B:
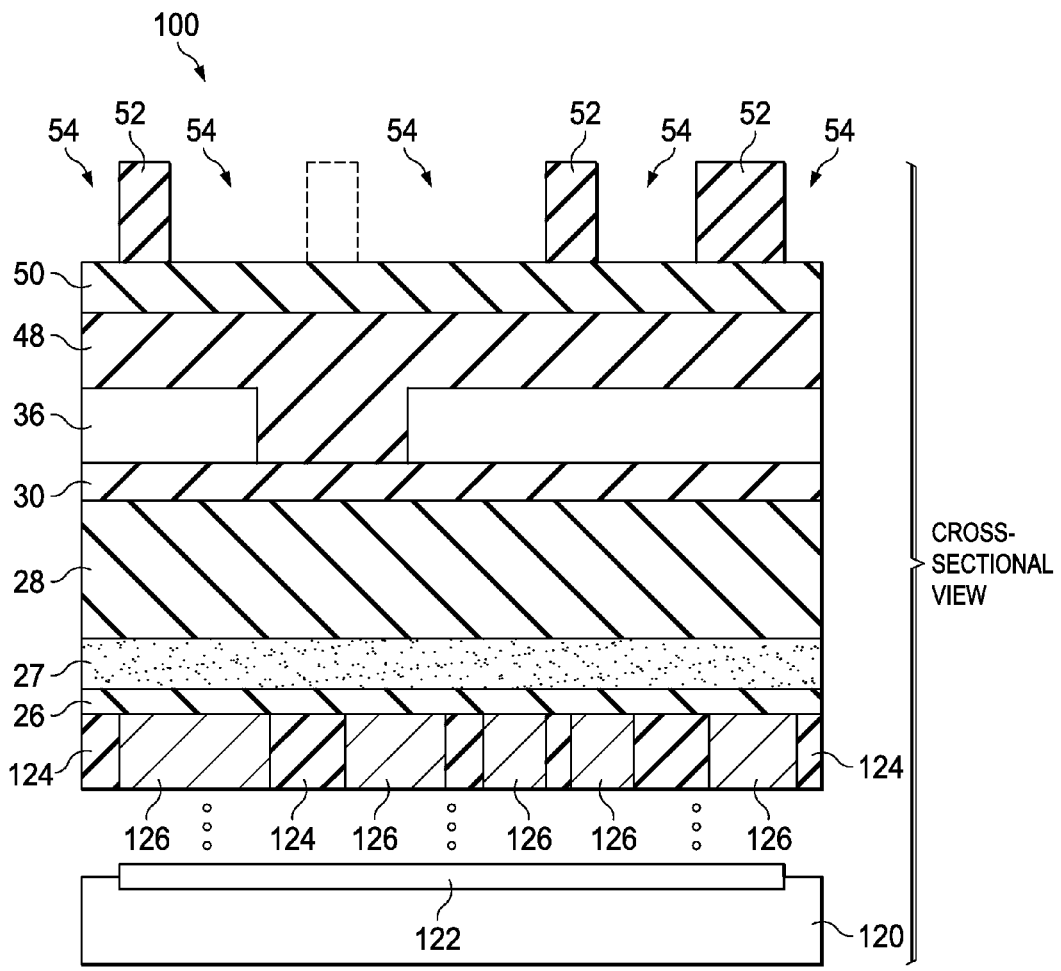

FIGS. 3A, 3B, 4A, and 4B illustrate a second photolithography and a second etching process performed on mandrel layer 36. Referring to FIGS. 3A and 3B, which include a top view and a cross-sectional view, respectively, bottom layer 48, middle layer 50, and upper layer 52 are formed. The material of bottom layer 48, middle layer 50, and upper layer 52 may be selected from the same candidate materials of bottom layer 38, middle layer 40, and upper layer 42 (FIG. 1B), respectively. Upper layer 52 is patterned to form openings 54 therein.

Figure 4A:
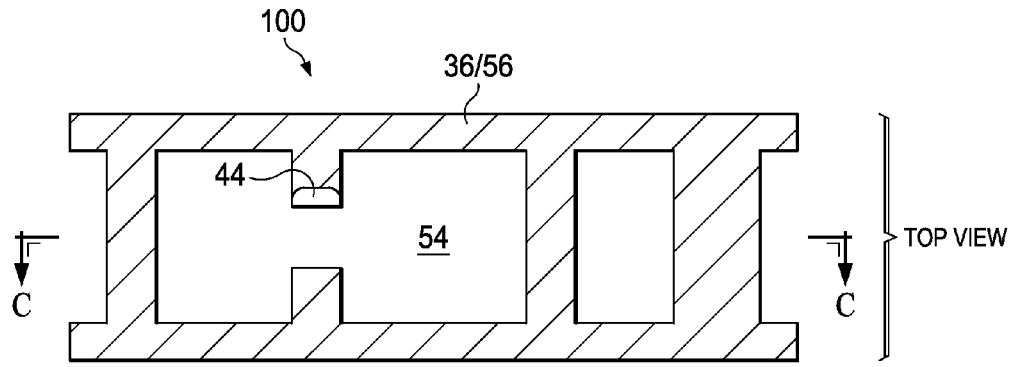
Figure 4B:
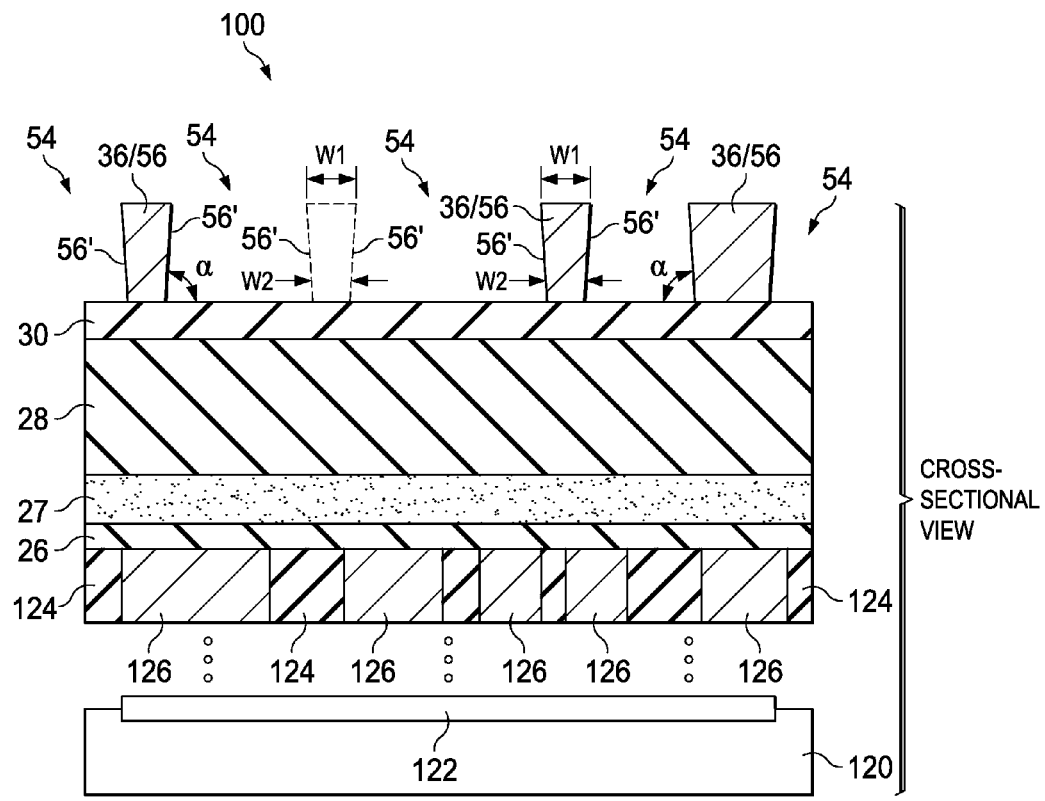

Next, as shown in FIGS. 4A and 4B, which include a top view and a cross-sectional view, respectively, the second etching process is performed to extend opening 54 into mandrel layer 36. As a result, mandrel layer 36 includes both openings 44 and 54. The remaining portions of mandrel layer 36 are referred to as mandrels 56 hereinafter. As shown in the top view in FIG. 4A, two of openings 54 are interconnected by opening 44 to form an I-shaped opening. It is realized that openings 54 and opening 44 have portions overlapping each other. In the following description, opening 44 refers to the portion interconnecting portion connecting openings 54, while the overlapped portions are considered as parts of openings 54.

In accordance with the embodiments of the present disclosure, in the etching of mandrel layer 36, process conditions for etching mandrel layer 36 are adjusted, so that remaining mandrels 56 have upper widths W1 greater than the respective bottom widths W2. In some embodiments, mandrels 56 have inversed trapezoid shapes, with edges 56' substantially straight in the side view. Edges 56' may also be curved in alternative embodiments. Tilt angles α of edges 56' is smaller than 90 degrees. In some embodiments, tilt angle α is between about 60 degrees and about 80 degrees, or may be between about 60 degrees and about 85 degrees.

In some exemplary embodiments, the etching of mandrel layer 36 is performed in a process chamber (not shown), which includes process gases such as $CF_4$, HBr, $Cl_2$, $O_2$, or combinations thereof. The flow rate of the process gases may be in the range between about 3 sccm and about 500 sccm. The pressure of the process gases may be in the range tween about 5 mtorr and about 50 mtorr. The etching may be performed with a high-frequency power applied for isotropic etching and a low-frequency power applied for anisotropic etching at the same time. For example, the high-frequency power may have the frequency of 13.6 MHz, and the low-frequency power may have the frequency of 2 MHz. The bias voltage is lower than about 200 volts. During the etching, the temperature of wafer 100 may be between about 15° C. and about 50° C. The process conditions are adjusted so that while the etching includes an anisotropic component, an isotropic effect is generated and increased to generate the desirable profile for mandrel 56. For example, increasing the pressure of the process gases, increasing the amount of the etching gases (such as $O_2$, HBr, and $Cl_2$) in the process gases, increasing the high-frequency power, and/or lowering the low-frequency power have the effect of increasing the isotropic effect of the etching, and hence generating the desirable profile for mandrels 56. The optimal process conditions are related to various factors, and may be found through experiments.

Figure 5A:
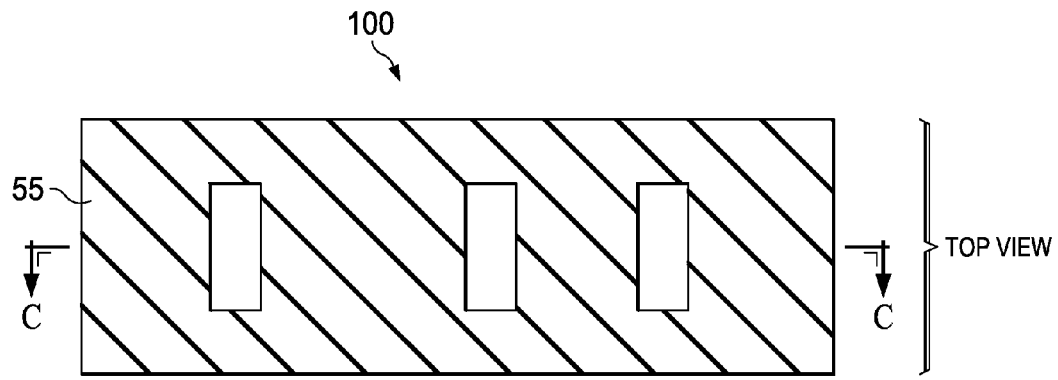
Figure 5B:
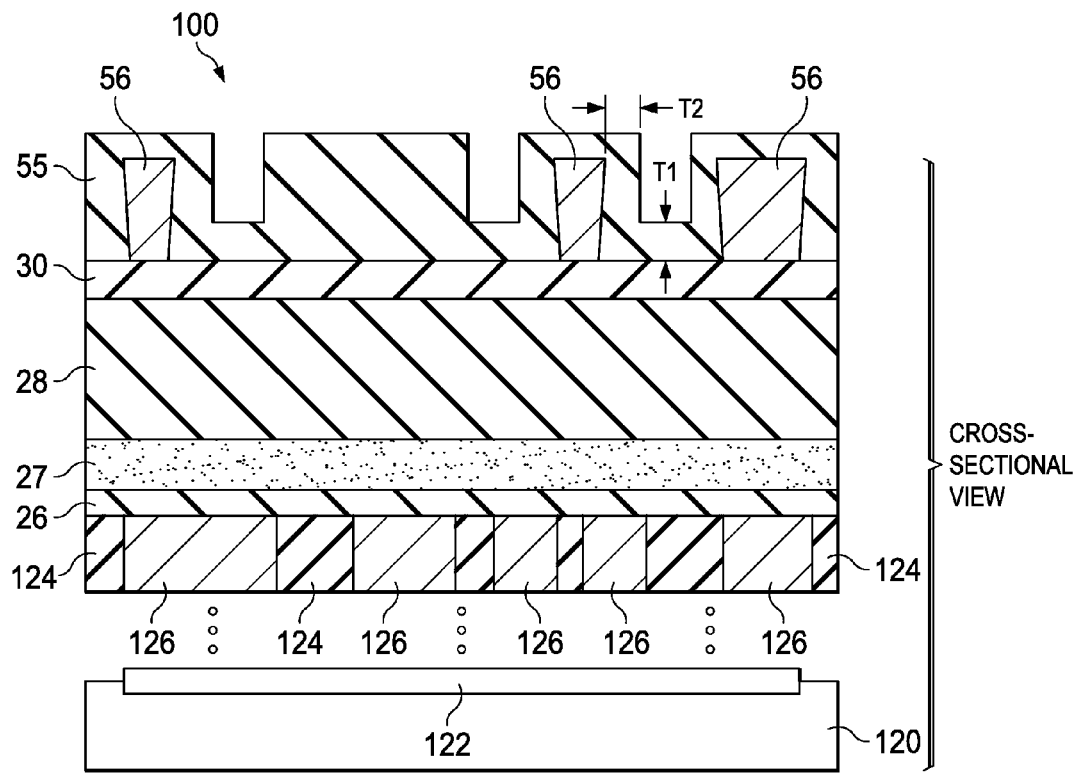

Referring to FIGS. 5A and 5B, which include a top view and a cross-sectional view, respectively, spacer layer 55 is blanket formed over the wafer 100 in FIGS. 4A and 4B. The material of spacer layer 55 may be selected to have a high etching selectivity with dielectric hard mask layer 30. For example, the material of spacer layer 55 may be selected from AlO, AlN, AlON, TaN, TIN, TiO, Si, SiO, SN, and other metals and metal alloys.

As also shown in FIG. 5B, spacer layer 55 is formed as a conformal layer, with the thickness T1 of its horizontal portions and the thickness T2 of its vertical portions close to each other, for example, with a difference between T1 and T2 smaller than about 20 percent of thickness T1.

An anisotropic etching is then performed to remove the horizontal portions of spacer layer 55, while the vertical portions of spacer layer 55 remain, and are referred to as spacers 58 hereinafter. The result structure is shown in FIGS. 6A and 6B, which include a top view and a cross-sectional view, respectively.

When spacer layer 55 (FIG. 5B) is formed, thickness T2 of spacer layer 55 is also equal to or greater than a half of width W1 (FIG. 1A) of opening 44. As a result, as shown in FIG. 5B, the sidewall (vertical) portions of spacer layer 55, which sidewall portions are on opposite sidewalls of opening 44, merge with each other to fill an entirety of the opening 44. As a result, the portion of dielectric hard mask 30 underlying opening 44 is fully covered by spacers 58. In some embodiments, spacers 58 fill an entirety, or the lower part, of opening 44. On the other hand, as shown in FIG. 6A, widths W4 of openings 54 are greater than two times thickness T2 (FIG. 5B) of spacer layer 55, so that each of openings 54 has a center portion 54' remaining not filled (in the top view) by spacers 58. As shown in FIG. 6B, dielectric hard mask 30 is exposed through openings 54'.

Figure 6A:
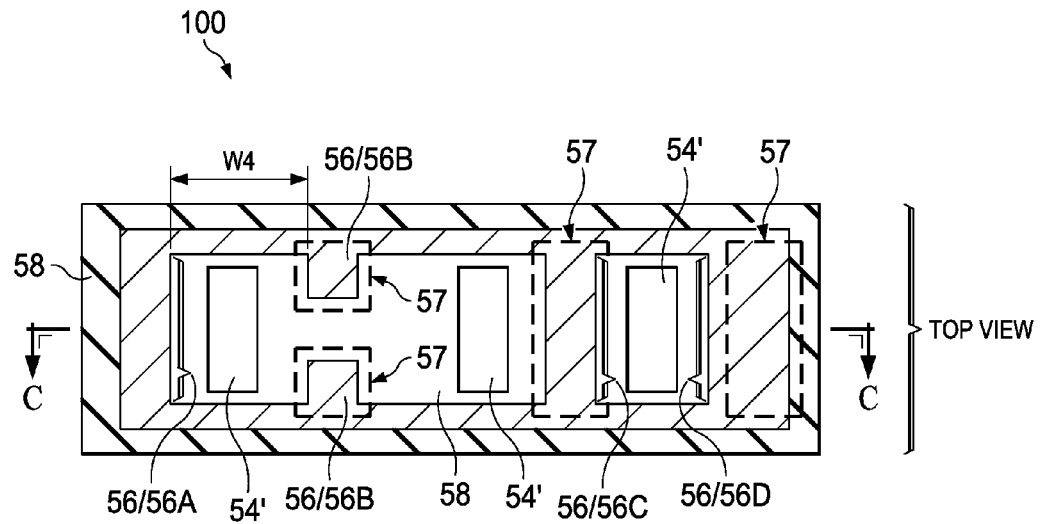
Figure 6B:
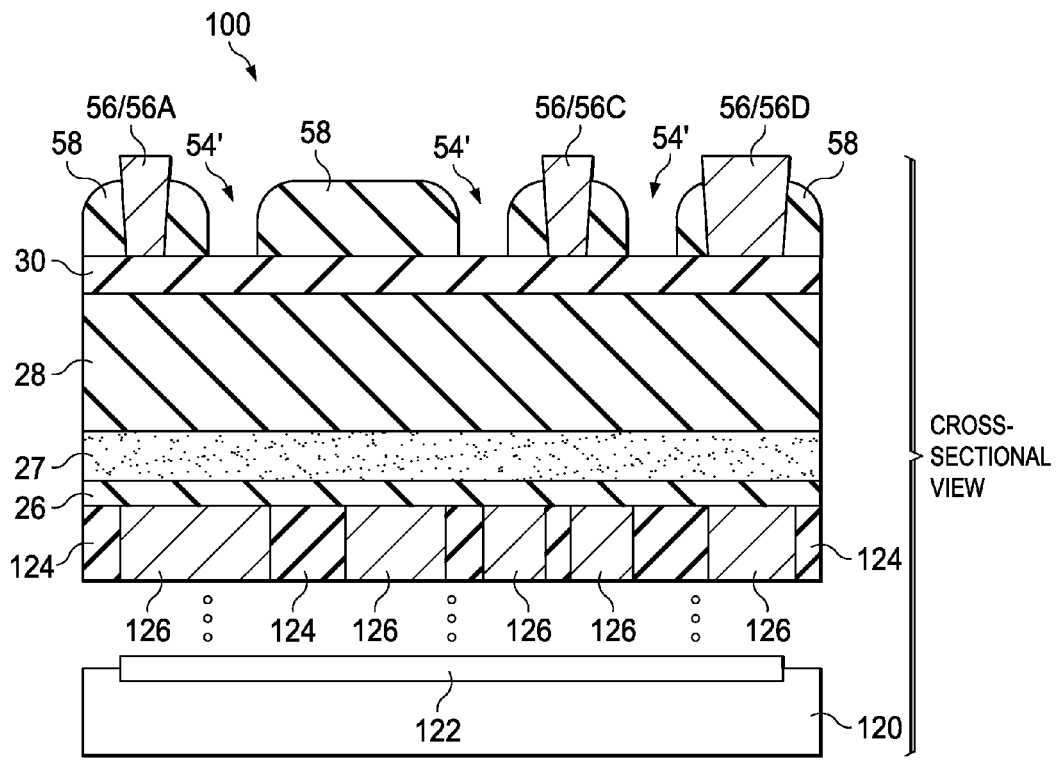
Figure 7A:
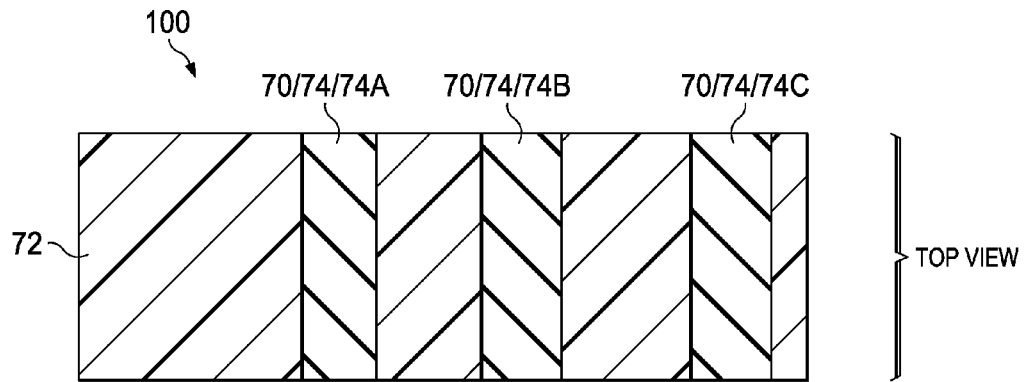
Figure 7B:
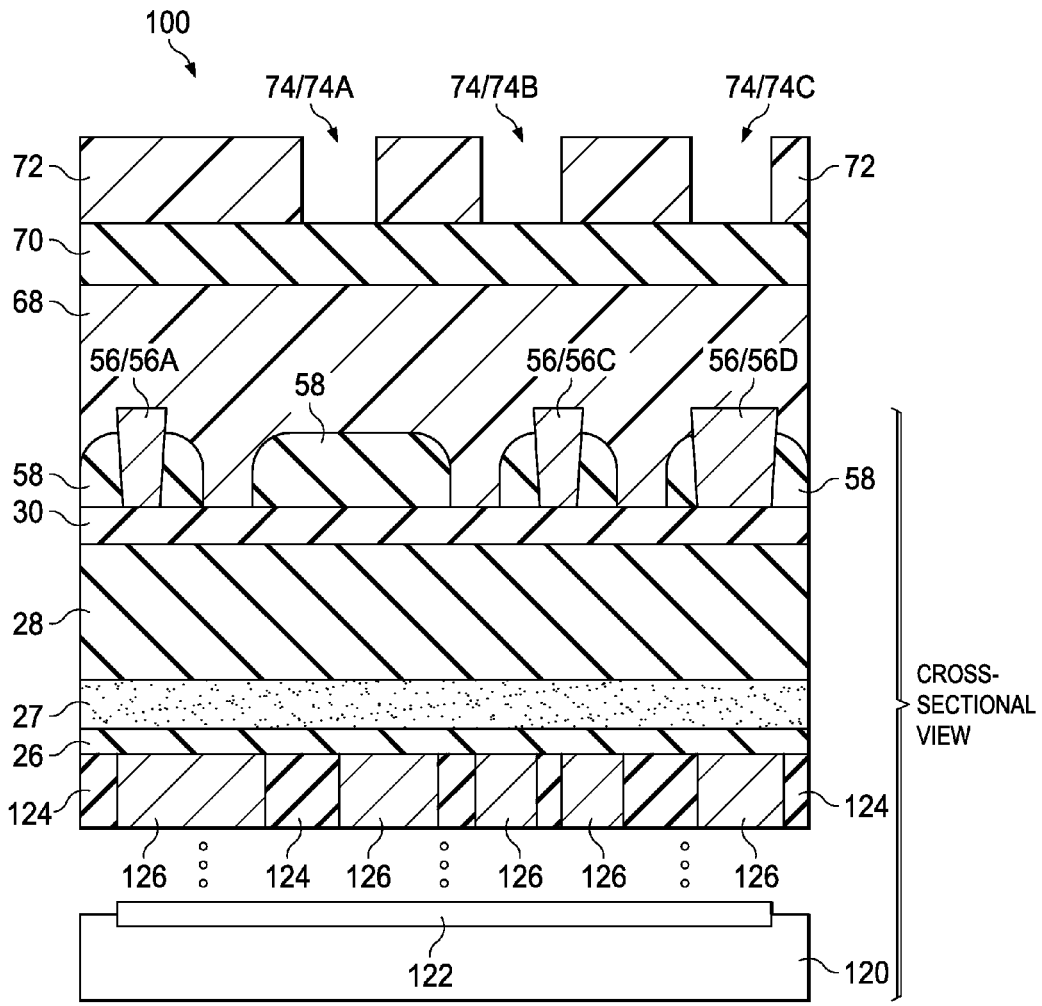

In FIGS. 7A, 7B, 8A and 8B, some undesirable mandrel portions, such as what are marked in dashed rectangles 57 in FIG. 6A, are etched. Referring to FIGS. 7A and 7B, which include a top view and a cross-sectional view, respectively, bottom layer 68, middle layer 70, and upper layer 72 are formed. The material of bottom layer 68, middle layer 70, and upper layer 72 may be selected from the same candidate materials of bottom layer 38, middle layer 40, and upper layer 42 (FIG. 1B), respectively. Upper layer 72 is patterned to form openings 74 (including 74A, 74B, and 74C) therein.

Mandrel 56A is overlapped by upper layer 72. Mandrel 56B is overlapped by opening 74B, while a first portion of mandrel 56C is overlapped by opening 74C, and a second portion is overlapped by upper layer 72.

Figure 8A:
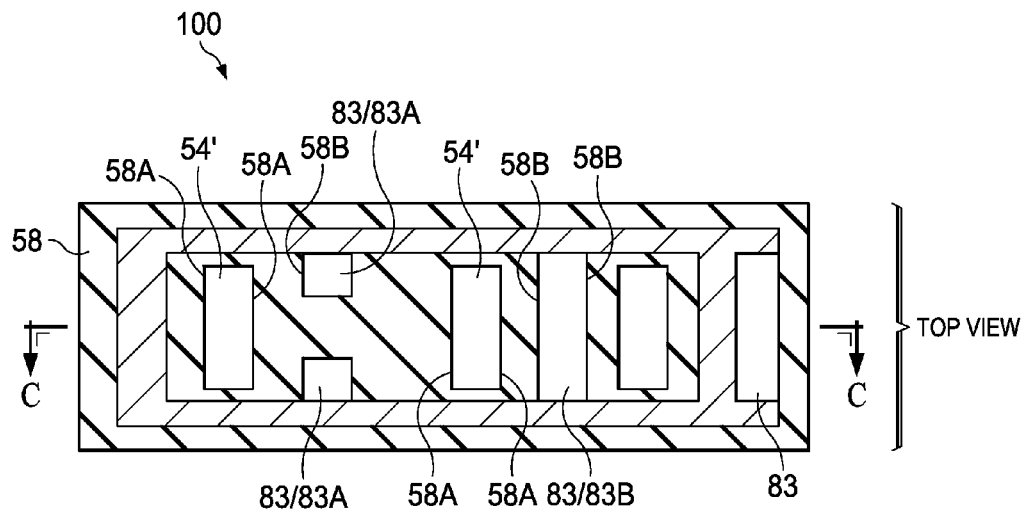
Figure 8B:
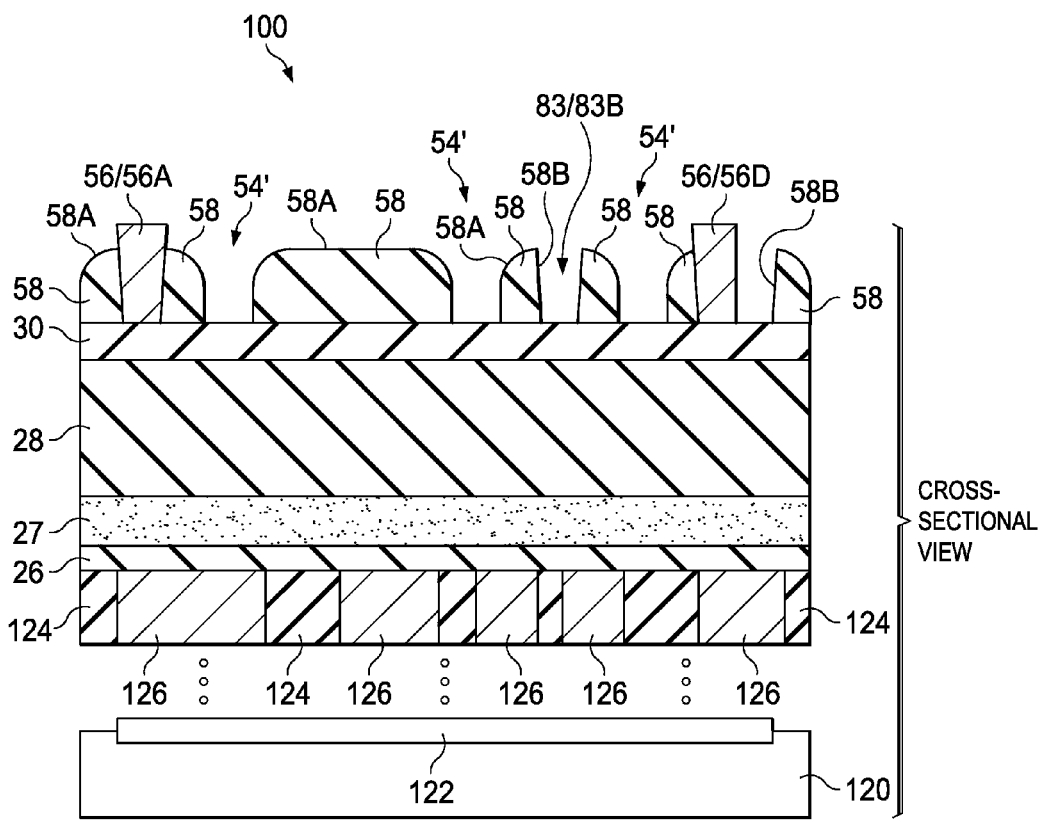
Figure 10:
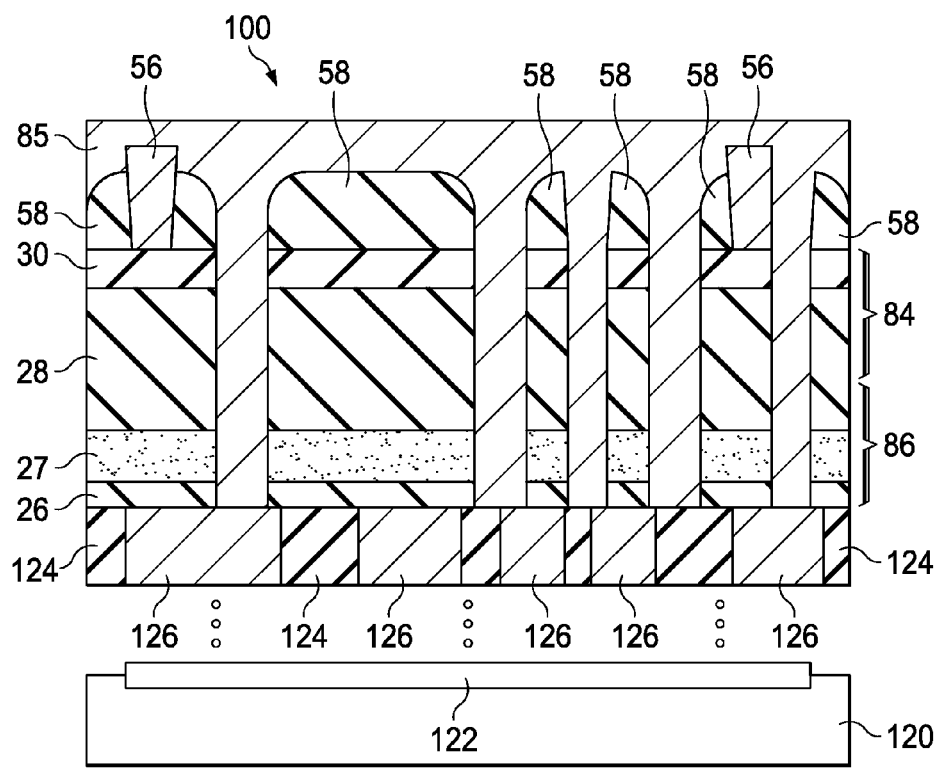

Next, as shown in FIGS. 8A and 8B, which include a top view and a cross-sectional view, respectively, an etching process is performed to remove portions of mandrels 56B and 56C (FIGS. 6A and 6B). A first portion of mandrel 56D is removed, while a second portion of mandrel 56D remains. As shown in FIGS. 8A and 8B, openings 83 (including 83A and 83B) are formed between neighboring spacers 58. Spacers 58 include edges 58A and 58B. Edges 58A are formed due to the etching of spacer layer 55 (FIGS. 5A, 5B, 6A and 6B). Accordingly, edges 58A are slopped. Edges 58B of spacers 58 are formed due to the removal of mandrels 56. Since mandrels 56 have top widths greater than the respective bottom widths, the resulting edges 58B are also slopped. Accordingly, openings, for example, opening 83B, have top width greater than the respective bottom widths. Openings 83 are thus referred to as having horn shapes. In addition, openings 54' also have horn shapes. This is beneficial for the subsequent gap-filling process as shown in FIG. 10. As a comparison, if mandrels 56 have vertical edges, opening 83 will have vertical edges, and the subsequent gap-filling is more difficult.

Figure 9:
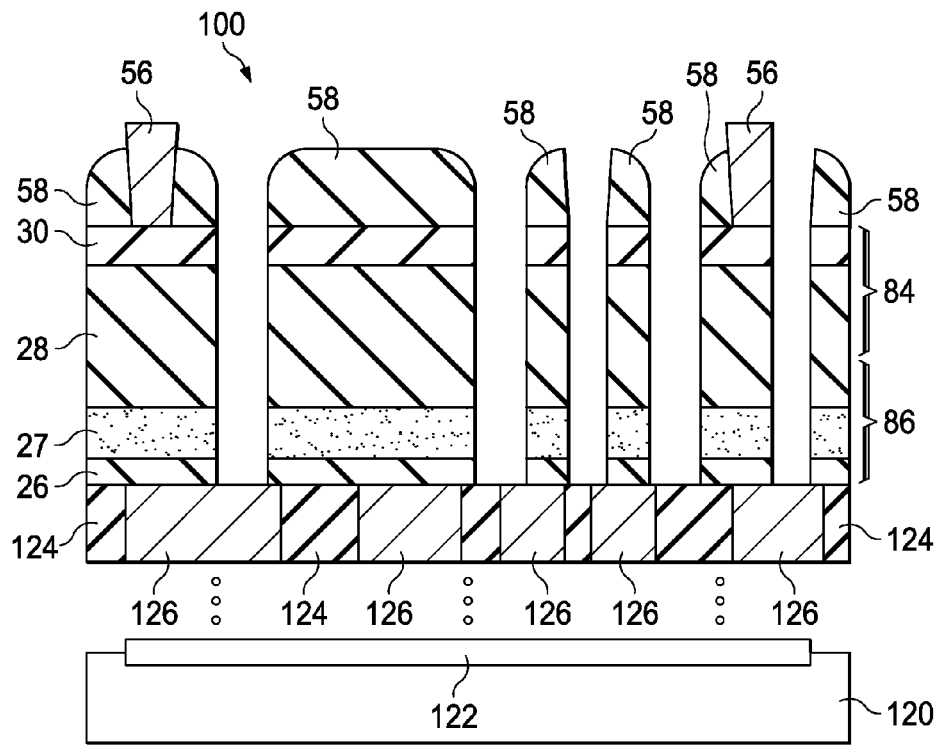

Referring to FIG. 9, mandrels 56 and spacers 58 are in combination used as an etching mask to etch the underlying dielectric hard mask 30 and low-k dielectric layer 28, so that trenches 84 are formed. Additional process steps are also performed to define and etch low-k dielectric layer 28 and dielectric layer 27 to form via openings 86 underlying trenches 84. Etch stop layer 26 is also etched. Conductive features 126 are exposed through trenches 84 and via openings 86. Although trenches 84 and via openings 86 are shown as having the same widths in the illustrated plane, in a vertical plane perpendicular to the illustrated plane, via openings 86 have smaller widths than trenches 84.

As shown in FIG. 9, there is no metal hard mask layer (and there is a single dielectric hard mask layer) between mandrels 56/spacers 58 and the underlying low-k dielectric layer 28. Therefore, the patterns defined by mandrels 56 and spacers 58 may be transferred directly into low-k dielectric layer 28 without the need of transferring to a metal hard mask first and then transferred from the metal hard mask to low-k dielectric layer 28. The process steps related to otherwise needed etching and the rounding of the metal hard mask is thus no longer needed. The manufacturing cost is saved. Furthermore, with less etching effort, the damage to low-k dielectric layer 28 is less severe.

Figure 11:
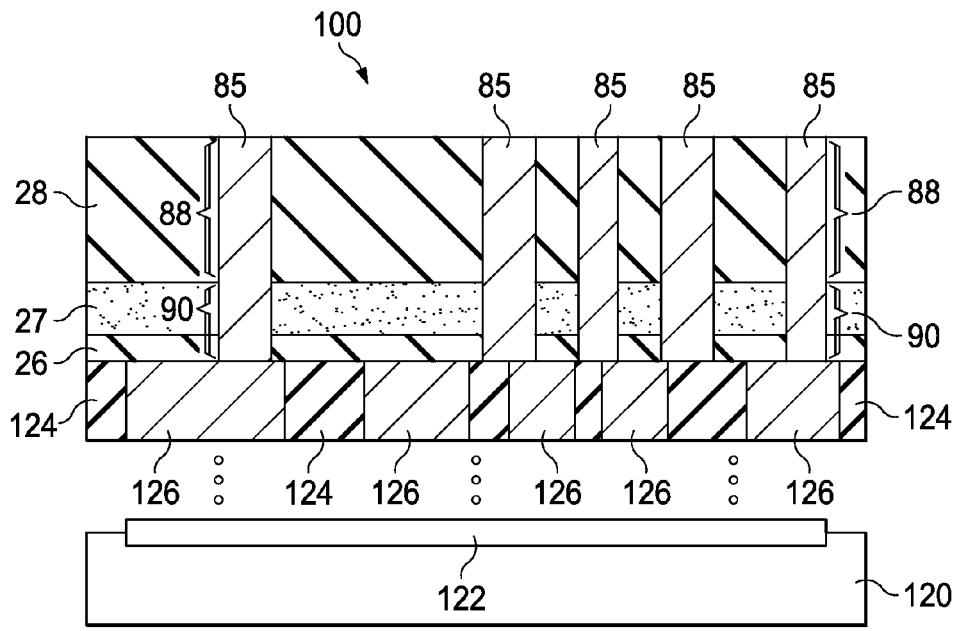

FIGS. 10 and 11 illustrate the filling of conductive material 85 into trenches 84 and via openings 86, and the removal of excess conductive material 85 (FIG. 10) to form metal lines 88 and vias 90 (FIG. 11), respectively. The formation may use a dual damascene process, wherein a conductive barrier layer such as titanium nitride, titanium, tantalum nitride, tantalum, or the like is formed on the sidewalls and the bottoms of trenches 84 and via openings 86. The remaining portions of trenches 84 and via openings 86 are then filled with conductive material 85, which may include copper or copper alloy. As shown in FIGS. 7A and 7B, with openings 83 (FIG. 9) having top widths greater than the respective bottom widths, the entrances of openings 83 are larger than vertical openings, hence the gap filling of conductive material 85 is easier, with the likelihood of generating voids reduced.

A Chemical Mechanical Polish (CMP) is then performed to remove excess portions of the barrier layer and the filling metal, forming metal lines 88 and vias 90 as shown in FIG. 11. Mandrels 56 and spacers 58 are also removed by the CMP. Metal lines 88 and vias 90 are electrically connected to the underlying conductive features 126. The CMP may be stopped on low-k dielectric layer 28, as shown in FIG. 11, or may be stopped on dielectric hard mask layer 30.

In alternative embodiments, target layer 28 is a semiconductor material. Accordingly, the process step shown in FIGS. 1 through 10 may be used to form trenches in target layer 28, and filling the trenches with a dielectric material to form Shallow Trench Isolation (STI) regions.

Figure 12A:
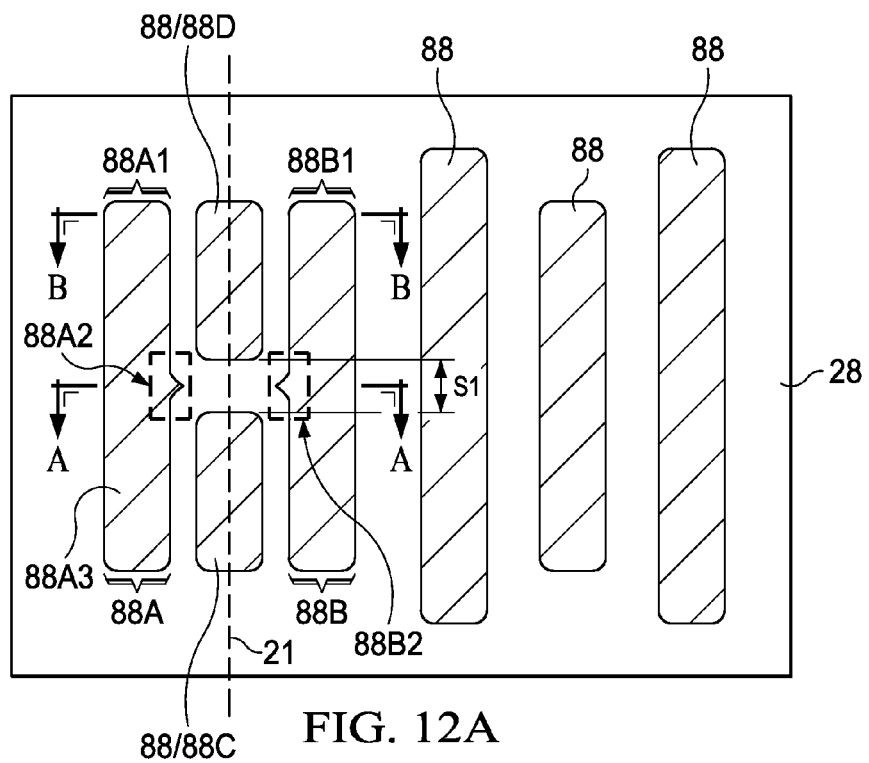
FIGS. 12A through 12C illustrate a top view and cross-sectional views of the features formed in the target layer.

FIG. 12A illustrates a top view of metal lines 88 formed in low-k dielectric layer 28. As shown in FIG. 12A, metal lines 88 include 88A, 88B, 88C, and 88D. Metal lines 88A and 88B are parallel to each other, and are closely located. Metal lines 88A and 88B are formed from openings 54' (FIGS. 8A and 8B). Metal lines 88C and 88D are located between metal lines 88A and 88B. Metal lines 88C and 88D are formed from openings 83A (FIGS. 8A and 8B). The lengthwise directions (and the lengthwise center lines) of metal lines 88C and 88D are aligned to the same straight line 21. In accordance with some embodiments, line end space 51 between metal lines 88C and 88D is between about 5 nm and about 100 nm. It is appreciated, however, that the values recited throughout the description are merely examples, and may be changed to different values. As shown in FIG. 12A, metal line 88A includes main portion 88A1, which is rectangular, and tip 88A2 protruding beyond edge 88A3 and toward the space between metal lines 88C and 88D. Similarly, metal line 88B includes main portion 88B1, which is rectangular, and tip 88B2 protruding beyond edge 88B3 and toward the space between metal lines 88C and 88D. The tip portions are formed due to the formation of spacers 58 (including 58A and 58B), as shown in FIGS. 8A and 8B, wherein openings 54' have tip portions.

Figure 12B:
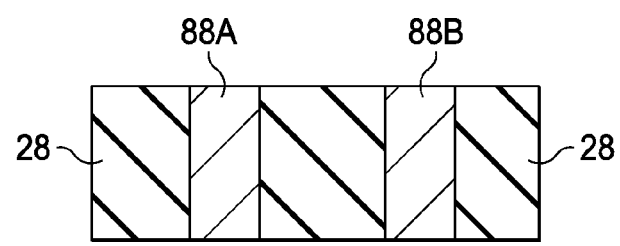
Figure 12C:
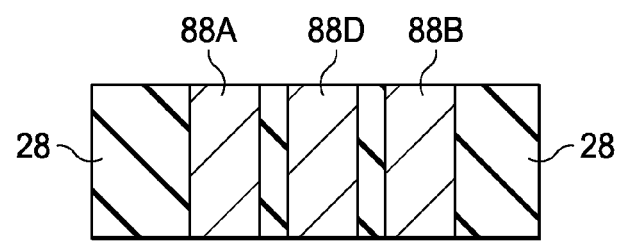

FIGS. 12B and 12C are cross-sectional views of the structure shown in FIG. 12A, wherein the cross-sectional views are obtained from the vertical plane containing lines A-A and B-B, respectively, in FIG. 12A.

The embodiments of the present disclosure have some advantageous features. By forming mandrels having top widths greater than the respective bottom widths, it is easy to fill a conductive material such as copper into trench openings and via openings. The likelihood of causing incomplete gap filling is thus reduced. With no metal hard mask formed under mandrels, the damage to the low-k dielectric layer caused by the metal hard mask patterning is avoided.

In accordance with some embodiments, a method includes forming a mandrel layer over a target layer, and etching the mandrel layer to form mandrels. The mandrels have top widths greater than respective bottom widths, and the mandrels define a first opening in the mandrel layer. The first opening has an I-shape and includes two parallel portions and a connecting portion interconnecting the two parallel portions. Spacers are formed on sidewalls of the first opening. The spacers fill the connecting portion, wherein a center portion of each of the two parallel portions is unfilled by the spacers. Portions of the first opening that are unfilled by the spacers are extended into the target layer.

In accordance with other embodiments, a method includes forming a mandrel layer over a target layer, performing a first etching step on the mandrel layer to form a first opening in the mandrel layer, and performing a second etching step on the mandrel layer to form a second opening and a third opening parallel to each other, wherein opposite ends of the first opening are connected to the second opening and the third opening to form an I-shaped opening. The method further includes forming a blanket spacer layer over the mandrel layer, wherein the blanket spacer layer extends into the I-shaped opening, and removing portions of the blanket spacer layer over the mandrel layer, with remaining portions of the blanket spacer layer forming spacers. The spacers include a connecting portion filling the first opening, wherein center portions of the second opening and the third opening are unfilled by the spacers. The mandrel layer is etched to remove portions of the mandrel layer to form a fourth opening and a fifth opening in the mandrel layer, wherein the fourth opening and the fifth opening are between the second opening and the third opening. The method further includes using the mandrel layer and the spacers as an etching mask to etch the target layer to form trenches in the target layer. The trenches are filled with a material, wherein the material includes portions over and contacting remaining portions of the mandrel layer and the spacers.

In accordance with yet other embodiments, a method includes forming a mandrel layer over a low-k dielectric layer, performing a first etching step on the mandrel layer to form a first opening in the mandrel layer, and performing a second etching step on the mandrel layer to form a second opening and a third opening parallel to each other, wherein remaining portions of mandrel layer comprise mandrels having top widths and bottom widths smaller than the respective top widths. Opposite ends of the first opening are connected to the second opening and the third opening to form an I-shaped opening. The method further includes forming a blanket spacer layer over the mandrel layer, wherein the blanket spacer layer extends into the I-shaped opening, removing portions of the blanket spacer layer over the mandrel layer, with remaining portions of the blanket spacer layer forming spacers. The spacers include a connecting portion filling an entirety of a portion of the first opening not overlapping the second opening and the third opening, wherein center portions of the second opening and the third opening are unfilled by the spacers. The portions of the mandrels are etched to form a fourth opening and a fifth opening in the mandrel layer, wherein the fourth opening and the fifth opening are on opposite sides of the connecting portion of the spacers, and are between the second opening and the third opening.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a mandrel layer over a target layer;
   etching the mandrel layer to form mandrels, wherein the mandrels have top widths greater than respective bottom widths, and wherein the mandrels define a first opening in the mandrel layer, wherein the first opening has an I-shape and comprises:
      two parallel portions; and
      a connecting portion interconnecting the two parallel portions;
   forming spacers on sidewalls of the first opening, wherein the spacers fill the connecting portion, and wherein a center portion of each of the two parallel portions is unfilled by the spacers; and
   extending portions of the first opening unfilled by the spacers into the target layer.

2. The method of claim 1 further comprising:
   etching the mandrels layer to remove one of the mandrels to form a second opening, wherein the second opening has a top width and a bottom width smaller than the bottom width.

3. The method of claim 1 further comprising, after the first opening is extended into the target layer, filling the first opening with a conductive material, wherein the conductive material is over and contacting the mandrels and the spacers.

4. The method of claim 1, wherein the forming the spacers comprises:
   forming a spacer layer over the mandrels and on sidewalls of the mandrels, with the connecting portion of the first opening fully filled by the spacer layer; and
   performing an anisotropic etching to remove horizontal portions of the spacer layer.

5. The method of claim 1 further comprising, etching the mandrel layer to remove portions of the mandrel layer to form a second opening in the mandrel layer, with the second opening having a top width, and a bottom width smaller than the top width.

6. The method of claim 1, wherein the forming the mandrel layer comprises forming an amorphous silicon layer.

7. The method of claim 1 further comprising, before forming the mandrel layer, forming a dielectric hard mask layer over and contacting the target layer, and wherein the mandrel layer is over and contacting the dielectric hard mask layer.

8. A method comprising:
   forming a mandrel layer over a target layer;
   performing a first etching step on the mandrel layer to form a first opening in the mandrel layer;
   performing a second etching step on the mandrel layer to form a second opening and a third opening parallel to each other, wherein opposite ends of the first opening are connected to the second opening and the third opening to form an I-shaped opening;
   forming a blanket spacer layer over the mandrel layer, wherein the blanket spacer layer extends into the I-shaped opening;
   removing portions of the blanket spacer layer over the mandrel layer, with remaining portions of the blanket spacer layer forming spacers, wherein the spacers comprise a connecting portion filling the first opening, and wherein center portions of the second opening and the third opening are unfilled by the spacers;
   etching the mandrel layer to remove portions of the mandrel layer to form a fourth opening and a fifth opening in the mandrel layer, wherein the fourth opening and the fifth opening are between the second opening and the third opening;
   using the mandrel layer and the spacers as an etching mask to etch the target layer to form trenches in the target layer; and filling the trenches with a material, wherein the material comprises portions over and contacting remaining portions of the mandrel layer and the spacers.

9. The method of claim 8, wherein the second opening and the third opening are disconnected by the connecting portion of the spacers.

10. The method of claim 8, wherein after the second etching step, remaining portions of the mandrel layer comprise mandrels, and wherein the mandrels have top widths greater than respective bottom widths.

11. The method of claim 8, wherein the second etching step is performed using a process gas selected from the group consisting essentially of $CF_4$, HBr, $Cl_2$, $O_2$, and combinations thereof.

12. The method of claim 8, wherein the target layer comprises a low-k dielectric material, and wherein the filling the trenches comprises filling copper, and wherein the method further comprises performing a Chemical Mechanical Polish (CMP) to remove the mandrels.

13. The method of claim 8, wherein the first etching step and the second etching step are performed in separate processes using different photo resists.

14. The method of claim 8, wherein after the removing the portions of the blanket spacer layer, horizontal portions of the blanket spacer layer are removed, and vertical portions of the blanket spacer layer remain to form the spacers.

15. A method comprising:
forming a mandrel layer over a low-k dielectric layer;
performing a first etching step on the mandrel layer to form a first opening in the mandrel layer;
performing a second etching step on the mandrel layer to form a second opening and a third opening parallel to each other, wherein remaining portions of mandrel layer comprise mandrels having top widths and bottom widths smaller than the respective top widths, and wherein opposite ends of the first opening are connected to the second opening and the third opening to form an I-shaped opening;
forming a blanket spacer layer over the mandrel layer, wherein the blanket spacer layer extends into the I-shaped opening;
removing portions of the blanket spacer layer over the mandrel layer, with remaining portions of the blanket spacer layer forming spacers, wherein the spacers comprise a connecting portion filling an entirety of a portion of the first opening not overlapping the second opening and the third opening, and wherein center portions of the second opening and the third opening are unfilled by the spacers; and
etching the portions of the mandrels to form a fourth opening and a fifth opening in the mandrel layer, wherein the fourth opening and the fifth opening are on opposite sides of the connecting portion of the spacers, and are between the second opening and the third opening.

16. The method of claim 15 further comprising:
using the mandrels and the spacers as an etching mask to etch the low-k dielectric layer to form trenches in the low-k dielectric layer; and
filling the trenches with a material, wherein the material comprises portions over and contacting remaining portions of the mandrels and the spacers.

17. The method of claim 15 further comprising:
etching the low-k dielectric layer using the spacers and remaining portions of the mandrels as an etching mask to etch the low-k dielectric layer.

18. The method of claim 15, wherein after the second etching step, remaining portions of the mandrel layer comprise mandrels, and wherein the mandrels have top widths greater than respective bottom widths.

19. The method of claim 15, wherein the second etching step is performed using a process gas selected from the group consisting essentially of $CF_4$, HBr, $Cl_2$, $O_2$, and combinations thereof.

20. The method of claim 15 further comprises, performing a Chemical Mechanical Polish (CMP) to remove the mandrels.

* * * * *